United States Patent [19]
Kajiwara et al.

[11] Patent Number: 4,996,589
[45] Date of Patent: Feb. 26, 1991

[54] SEMICONDUCTOR MODULE AND COOLING DEVICE OF THE SAME

[75] Inventors: Ryoichi Kajiwara; Takao Funamoto, both of Hitachi; Mituo Kato, Hitachioota; Hiroshi Wachi; Tomohiko Shida, both of Hitachi, all of Japan

[73] Assignee: Hitachi, Ltd., Tokyo, Japan

[21] Appl. No.: 258,609

[22] Filed: Oct. 17, 1988

[30] Foreign Application Priority Data

Oct. 21, 1987 [JP] Japan ................................ 62-263856
Nov. 11, 1987 [JP] Japan ................................ 62-283318
Mar. 23, 1988 [JP] Japan ................................ 63-67436

[51] Int. Cl.$^5$ ........................................... H01L 25/04
[52] U.S. Cl. ........................................ 357/82; 357/79; 357/81
[58] Field of Search ............................ 357/82, 79, 81

[56] References Cited

U.S. PATENT DOCUMENTS 4,729,060 3/1988 Yamamoto et al. ................ 357/82

FOREIGN PATENT DOCUMENTS 0253248 12/1985 Japan ................................. 357/82

OTHER PUBLICATIONS

IBM-Tech. Dis. Bul.-Clark-vol. 19, No. 4, Sep. 1976, p. 1336.

Primary Examiner—Edward J. Wojciechowicz
Attorney, Agent, or Firm—Antonelli, Terry, Stout & Kraus

[57] ABSTRACT

A number of LSI chips (9) are mounted on a wiring substrate (12). A cooling element (68) comprises a housing (1), a bellows (2) and a cooling plate (6) for introducing a cooling medium. The cooling element is connected to the LSI chip by low melting solder, at the same time, the cooling plate is connected to the wiring substrate through a skirt (5) which is connected to the cooling plate and also connected to the wiring substrate by a low melting solder.

11 Claims, 8 Drawing Sheets

SEMICONDUCTOR MODULE AND COOLING DEVICE OF THE SAME

FIELD OF THE INVENTION

The present invention relates to a semiconductor module in which is mounted a number of semiconductor elements on a wiring substrate and which is provided with a cooling means for cooling the semiconductor elements; more specifically, the present invention relates to a semiconductor module which is suitable for a large scale computer and its cooling device.

BACKGROUND OF THE INVENTION

A semiconductor apparatus used for a high speed data processing apparatus etc. is designed so that the semiconductor elements are highly integrated and obtain large power for increasing the data processing speed. As a result, the thermal capacity generated at the semiconductor elements exceeds a limit value by which cooling may be effected by means of forced air cooling. Accordingly, it is proposed that such semiconductor elements are cooled by water, etc. of liquid or a boiling cooling medium in a semiconductor apparatus used for a large scale computer, etc..

As one method of cooling effectively a number of semiconductor elements mounted on a wiring substrate using a cooling liquid such as water, etc., there is an individual cooling method which cools semiconductor elements, respectively. For instance, such an individual cooling method is disclosed in FIG. 2 of Japanese Patent-Laid Open No. 60-160151 published on Aug. 21, 1985 with the title of "Cooling Method of Integrated Circuit", and FIG. 10 of Japanese Patent-Laid Open No. 61-220359 published on Sept. 30, 1986 with the title of "Cooling Structure of Semiconductor Module".

These known individual cooling methods for the semiconductor elements are characterized that a cooling plate is mounted on a semiconductor element, a bellows is connected between a housing having a channel of cooling liquid and the cooling plate, and a cooling liquid flowing through the housing is contacted by the cooling plate so that the semiconductor element is cooled, as will be explained later referring to FIGS. 1 and 2.

According to these individual cooling methods, the cooling effect of the semiconductor elements can be enhanced and the thermal resistances of the semiconductor elements can be decreased, since the cooling liquid can be introduced near the semiconductor elements.

Referring to FIG. 1, which corresponds to FIG. 2 of Japanese Patent-Laid Open No. 60-160151, 49 denotes a thermal conductive grease, 51 leads, 52 bonding wires, 53 a chip carrier (package), 54 solder connecting portion, 6 a cooling plate, 30 a O ring, 31 an flange, and 44 a nozzle. In the structure shown in FIG. 1, a thermal transmitting channel becomes short since cooling water is conducted near a LSI chip 9, and the cooling ability can be enhanced largely as compared with the conventional cooling method which cools the LSI chip by thermal conduction of a cooling fin since the device shown in FIG. 1 has not a space on a route of the thermal conducting channel. Since the displacements along the perpendicular and horizontal directions can be absorbed by the operation of the bellows 2 and the thermal conductive grease 49 against the thermal strain caused by the temperature difference or the thermal expansion coefficients between the wiring substrate 12 and the housing 1, a thermal fatigue service life can be enhanced at the solder connecting portion which is located between the package and the wiring substrate.

On the other hand, the device disclosed in FIG. 1 uses grease whose thermal conductivity is worse more than one figure compared with a metal for the purpose of having variable formation at stress of zero to the thermal conducting channel from the LSI chip to the cooling water. And, it is difficult to reduce the thickness of the grease to lower than ten $\mu$m on account of the surface tension of the grease. Therefore, it is difficult to decrease the cooling ability lower than 1° C./Watt of the thermal resistance. Accordingly, when a LSI chip is used in future, whose heating value exceeds more than 40 watts per one chip, the prior cooling structure of the device can not cope with the demanded cooling ability.

Referring to FIG. 2, which corresponds to FIG. 10 of Japanese Patent-Laid Open No. 61-220359, 61 and 62 denote solder connecting portions having a low melting point. In the structure shown in FIG. 2, since the distance between the cooling water and the LSI chip 9 is shorter than that shown in FIG. 1, and the thermal conducting channel is made of a metal or ceramic having a suitable thermal conductivity, the cooling performance of the device shown in FIG. 2 is remarkably improved compared with that shown in FIG. 1 so that the thermal resistance thereof becomes lower than 0.5° C./Watt. However, in the device shown in FIG. 2, since all the elements from the cooling plate 6 comprising the cap 3 and the cooling fin 4 to the wiring substrate 12, which is connected to the LSI chip 9 via the solder 10, are fixed by solders, the bellows 2 has to absorb all the thermal strains between the housing 1 and the wiring substrate 12. Although the displacement is absorbed by the deformation of the bellows when a thermal stress is produced between the wiring substrate and the housing, the stress is applied directly to the soldered connecting portions between the wiring substrate and the semiconductor elements.

In general, a bellows is easily deformed along the axial direction, but is not easily deformed to the vertical direction against the axial direction. Accordingly, large stress is produced by the displacement along the horizontal direction of the wiring substrate and the housing. On the contrary, the fatigue service life of the soldered connecting portion between the wiring substrate and the semiconductor elements is small under the compression stress, but is remarkably decreased under the shearing stress, namely the above-mentioned stress to the horizontal direction.

Accordingly, when the wiring substrate is made larger than 10 mm, the fatigue service life of the soldered connecting portion between the wiring substrate and the semiconductor elements is decreased based on the thermal stress in the shearing direction caused by the thermal variation in assembling or using the semiconductor module made by the solder connection so that the reliability of the device is remarkably reduced.

BACKGROUND OF THE INVENTION

An object of the present invention is to provide a semiconductor module which is able to relieve the stress applied to the soldered connecting portion between the wiring substrate and the semiconductor elements so that the lowering of the fatigue service life of the soldered connecting portion can be suppressed.

The present invention is as follows: In a semiconductor module comprising a number of semiconductor elements mounted on a wiring substrate, a cooling plate which is connected to the semiconductor elements and cooled by contacting a cooling medium, a housing having a channel for flowing the cooling medium which is in contact with the cooling plate, and a bellows for connecting the housing and the cooling plate and contacting the cooling medium within the housing to the cooling plate, characterized in that a portion of the cooling plate is connected directly to the wiring substrate.

By connecting directly the cooling plate and the wiring substrate, the strain caused by the deformation of the bellows is scarcely applied to the soldered connecting portion between the wiring substrate and the semiconductor elements, but is applied to the fixing portion of the wiring substrate and the semiconductor elements. Accordingly, a lowering of the fatigue service life of the soldered connecting portion between the semiconductor elements and the wiring substrate can be avoided.

The cooling plate is able to be provided to each semiconductor element as disclosed in FIGS. 3-5, or one cooling plate can be provided to two or three semiconductor elements.

The cooling plate and the semiconductor elements suitably may be connected by solder. Since the solder is superior to the thermal conductivity, the thickness of the solder can be made thin so that the cooling effect of the semiconductor elements can be enhanced.

The semiconductor elements mounted on the wiring substrate can be connected directly to the wiring substrate by soldering, or can be connected in such a manner that the semiconductor elements are enclosed in chip carriers and lead wires connected to the semiconductor elements are lead out of the outside of the chip carriers, and the lead wires and the wiring substrate are connected by soldering. One example of enclosing the semiconductor elements within the chip carriers is disclosed in FIG. 1 of Japanese Patent-Laid Open No. 58-43553 published on Mar. 14, 1983 having the title of "Multichip LSI package". The device of the present invention can be formed as indicated in the above-mentioned prior art.

Concerning the manufacturing of the bellows, the device of the present invention can employ the method disclosed in FIG. 9 and 10 of Japanese Patent-Laid Open No. 61-220359.

Concerning the method of fixing the cooling plate to the wiring substrate, it can be made in such a manner that the cooling plate includes a skirt, and the skirt can be connected to the wiring substrate using soldering as disclosed in FIGS. 3 and 4; or the cooling plate fixing members can be mounted on the wiring substrate, respectively, and the cooling plates connected to the cooling plate fixing members as disclosed on FIG. 5.

Concerning the bellows, they can be fixed in such a manner that two bellows are connected to one cooling plate, one bellows is used for conducting the flow of the cooling medium from the housing to the cooling plate, and the other bellows is used for the flow of the cooling medium from the cooling plate to the housing as disclosed in FIGS. 3 and 4. The bellows can be connected to each cooling plate as disclosed in FIG. 5. Or, one bellows can produced flow of the cooling medium continuously as well as FIGS. 3 and 4 by dividing one bellows into two flow channels.

Concerning the semiconductor elements, they can be provided, for instance, as LSI (large scale integration) chips. Hereunder, we will explain the embodiments in which LSI chips are used.

Concerning the cooling medium, it can be a liquid such as water and gas. Among these cooling mediums, it is preferable to use a liquid.

According to the present invention, the cooling plate is fixed to the wiring substrate mechanically or by soldering corresponding to each LSI chip. The relative displacement or gap between the wiring substrate and the cooling plate is not created, even if an outer force is applied to the cooling plate as far as the connecting portion is not broken. Accordingly, even if a thermal strain is produced based on the thermal differences or the difference of the thermal expansion coefficients between the wiring substrate and the housing, under the condition that the back surface of the LSI chip, namely, one surface of the LSI chip which is not connected to the wiring substrate, is fixed to the cooling plate by soldering, the strain can be absorbed by the deformation of the bellows so that the stress which occurs at that time is suspended by the fixing portion of the cooling plate and the wiring substrate. According to the present invention, an outer force is not applied to the soldered connecting portion between the LSI chip and the wiring substrate so that the damage or the lowering of the thermal fatigue service life is not caused thereby. At the same time, since the cooling plate and the LSI chip are connected mechanically, the thermal resistance becomes lower than 0.5° C./Watt as the cooling performance, and high efficient cooling can be attained.

The present invention proposes a structure that the skirt is put on the under portion of the cooling plate to form a cap configuration, and the LSI chip is sealed air-tightly by the wiring substrate and the cooling plate. Accordingly, even if water leakage occurs causing corrosion or breakage of the thin bellows, the cooling water is not contacted directly to the LSI chip, and the LSI chip is not damaged thereby. By replacing the air sealed inside with an inert gas such as He, etc., the corrosion or the breakage of the LSI wiring or the soldered connecting portion can be prevented so that the reliability of the semiconductor module can be increased remarkably.

DETAILED DESCRIPTION OF THE PREFERRED EMBODIMENTS

Figure 1:
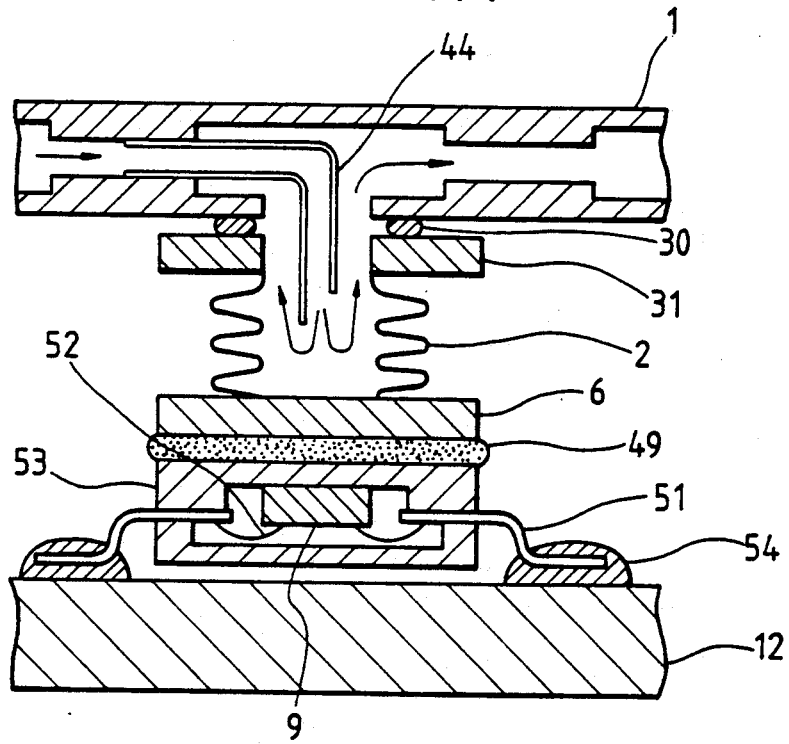
FIG. 1 shows a sectional view of a semiconductor module of one prior art.
Figure 2:
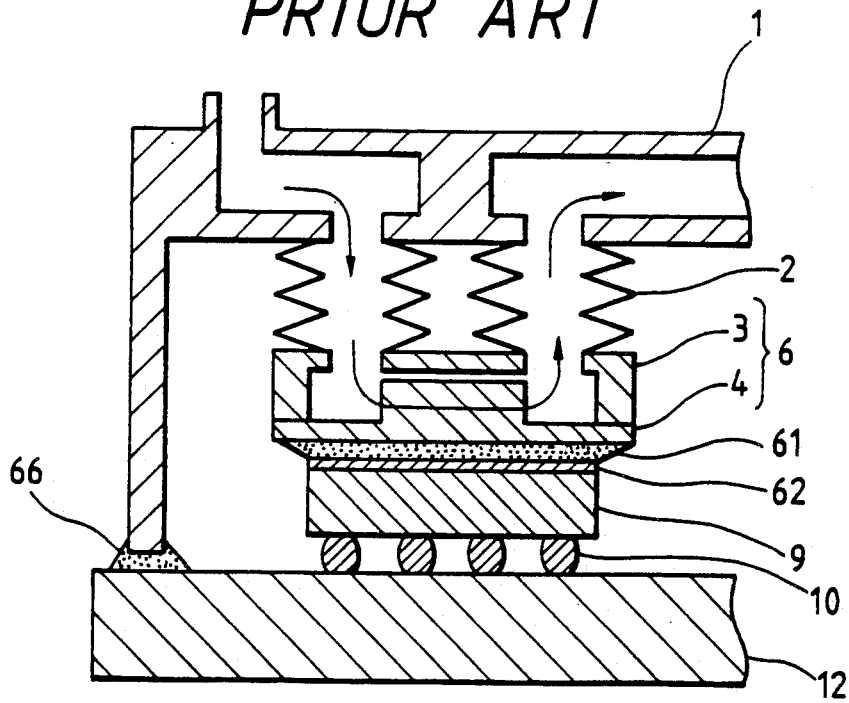
FIG. 2 shows a sectional view of a semiconductor module of another prior art.
Figure 3:
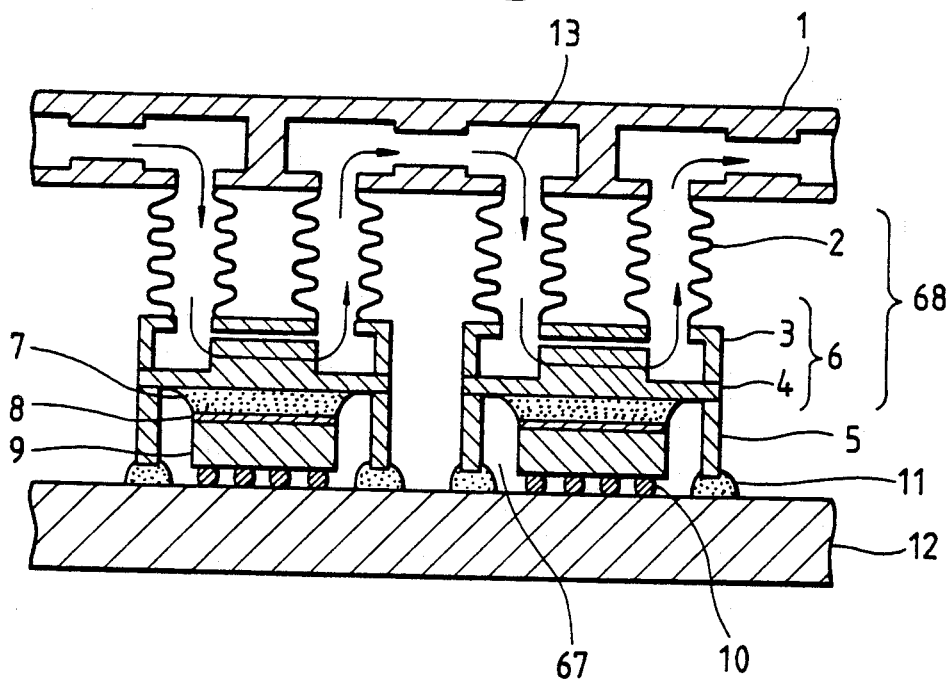
FIG. 3 shows a sectional view of a semiconductor module of the first embodiment of the present invention.

Referring to FIG. 3, the cooling plate 6 is provided to each LSI chip 9, the skirt 5 is fixed to the cooling plate, and the cooling plate and the wiring substrate 12 are connected. In the housing 1 in which is provided the circulating channel of the cooling water 13, a cooling element 68 is arranged corresponding to each LSI chip 9. The cooling element 68 comprises the cooling plate 6 and two metal bellows 2 for supplying and returning the cooling medium. The cooling plate 6 comprises the cooling fin 4 for transmitting the heat from the LSI chip 9 effectively to the cooling medium and the cap 3 for introducing the cooling medium therein.

One end of the skirt is connected to the cooling plate, and other end of the skirt is connected to the wiring substrate 12 by the solder 11. It is preferable that the housing 1, the bellows 2, and the cap 3 are made from a metal having high corrosion, for instance, SUS, Ti, Ti alloy, Ni, or Ni alloy. It is preferable that the cooling fin 4 is made from a metal having high thermal conductivity, for instance, Cu, Ni, Ag, ceramic AlN, SiC, and $Al_2O_3$, etc.. It is preferable that the skirt 5 is made from Fe-Ni system alloy or ceramic material which is same as the wiring substrate for making the thermal expansion coefficient thereof correspond to that of the wiring substrate. The connection between the housing 1 and the bellows 2, between the bellows 2 and the cap 3, between the cap 3 and the cooling fin 4, and between the cooling fin 4 and the skirt 5 are carried out by diffusion junction or soldering of high melting point such as Ag solder, Ni solder, or Au solder. The back surface of the LSI chip is formed by an insulating film comprising $SiO_2$ oxidized in high temperature, metalized by Cr-Ni-Au, and connected to the cooling fin 4 by the solder 7 having a low melting point through the metalized layer 8. The wiring substrate 12 and the skirt 5 are sealed air-tightly. Pb-Sn-In alloy is used as a low melting solder. The space 67, in which the LSI chip is enclosed, is filled by He.

According to the embodiment disclosed in FIG. 3, since the LSI chip 9 and the cooling fin 4 are connected mechanically by the low melting solder 7, the thermal conductivity of the LSI chip 9 is high and the cooling performance thereof is excellent. Even if a gap appears between the wiring substrate and the housing caused by heat, etc., the stress scarcely affects the soldered connecting portion 10 based on the deformation of the bellows, since the cooling plate is connected to the wiring substrate by soldering; and a fatigue service life of the soldered connected portion is not lowered. Since the LSI chip is perfectly sealed in an air-tight manner under the atmosphere of He, the LSI chip is not damaged when water leakage occurs at the connecting portion of the cooling element or the bellows, and the chip wiring and the soldered connecting portion are not corroded by humidity. Accordingly, the embodiment disclosed in FIG. 3 can be enhanced in the reliability of the semiconductor device.

Figure 4:
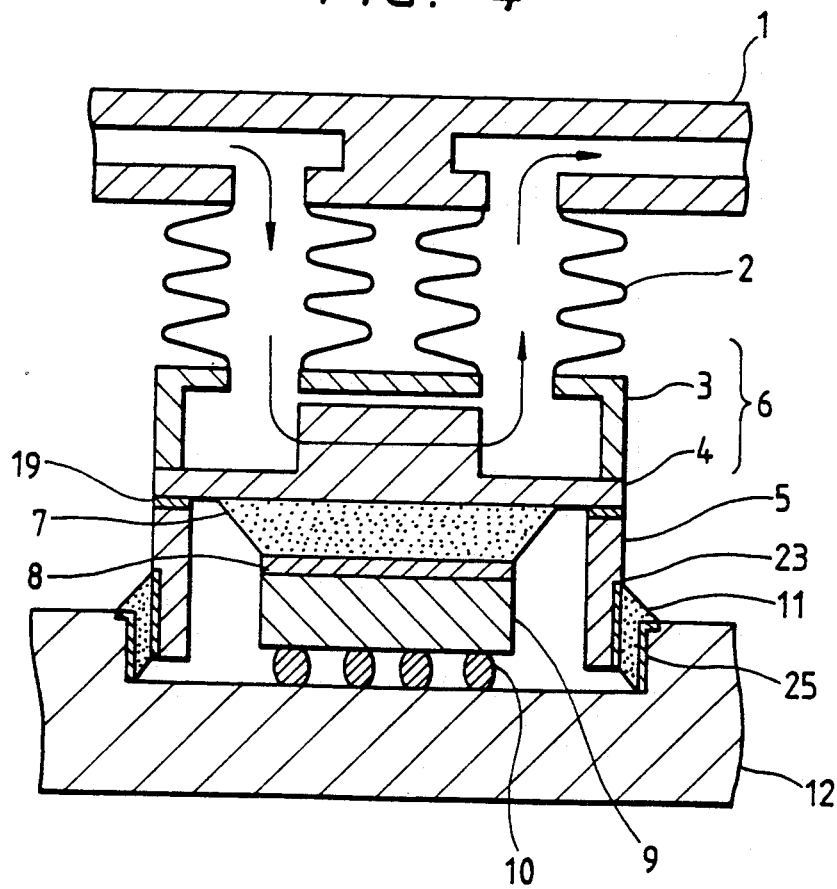
FIG. 4 shows a sectional view of a semiconductor module of the second embodiment of the present invention.

Referring to FIG. 4, the structure from the housing 1 to the cooling plate 6 is same as that of FIG. 3. The skirt 5 comprises mullite ceramic as well as the wiring substrate 12, and is soldered to the cooling fin 4 by Ag solder. The cooling fin 4 made from Ni and the LSI chip 9 are connected by Pb-Sn-In system solder 7 having a melting point of 90°-150° C. through the metalized layer 8 formed on the $SiO_2$ oxidized film. The wiring substrate 12 is recessed at its chip mounting portion matching the dimension of the cooling plate 6. The side surface of the recessed portion of the wiring substrate and the side surface of the skirt 5 are connected by the solder 11 through the metalized layers 23 and 25 formed on these surfaces, respectively. The solder 11 has a composition which is slightly lower in its melting point than the solder 7. The solder 10 comprises 95Pb-5Sn having a melting point of 280° C.

According to the embodiment disclosed in FIG. 4, the device shown in FIG. 4 can attain remarkable effect in the cooling performance of the LSI chip, the fatigue service life of the soldered connecting portion 10 and the reliability of the LSI chip as well as the device shown in FIG. 3.

Figure 5:
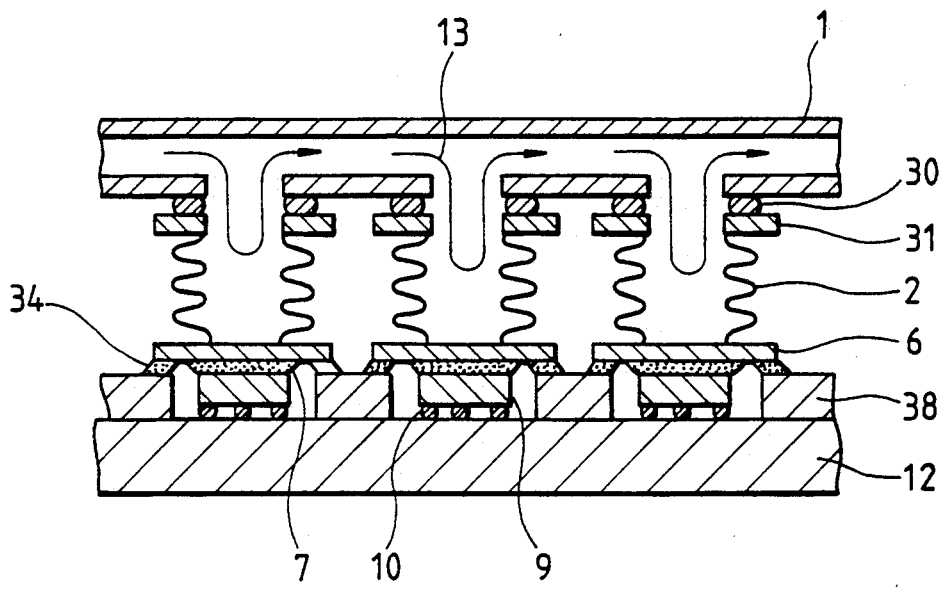
FIG. 5 shows a sectional view of a semiconductor module of the third embodiment of the present invention.

Referring to FIG. 5, the cooling plate fixing member 38 is fixed to the wiring substrate, and the fixing member 38 and the cooling plate 6 are connected by the solder 34. When the metal bellows 2 is connected to the housing 1, the metal bellows 2 is connected to the flange 31, and the O ring 30 is arranged between the flange 31 and the housing 1. The metal bellows is held between the housing and the cooling plate by the spring function of the metal bellows.

The cooling plate fixing member 38 is made by pressing of the ceramic plate which is the same as the wiring substrate in the material thereof.

Figure 6:
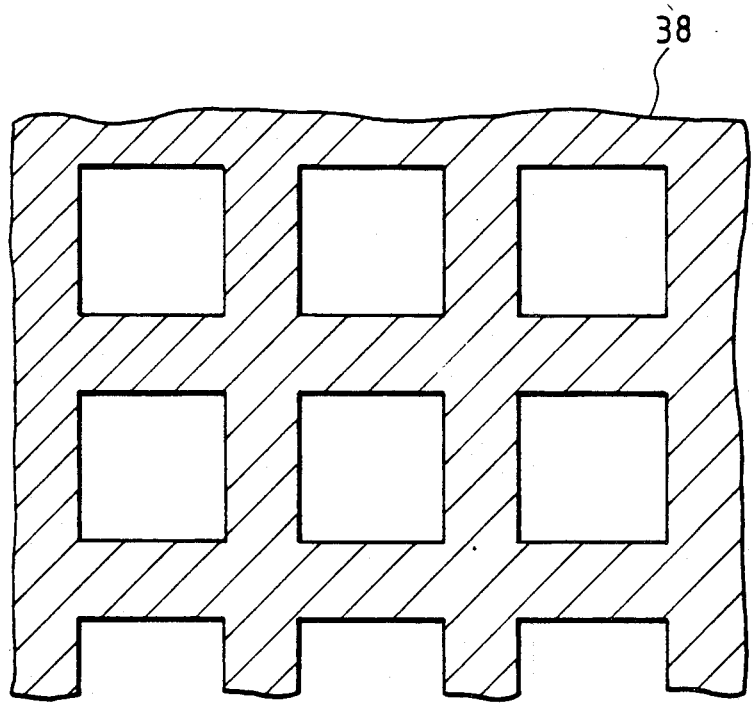
FIG. 6 shows a plain sectional view of the cooling plate fixing member shown in FIG. 5.

According to the embodiment disclosed in FIGS. 5 and 6, the configuration of the cooling plate 6 can be simplified. Since the cooling plate fixing member 38 is easily manufactured, the assembling of the semiconductor module can be easier compared with that shown in FIG. 4.

One of the features of the present invention is that the bellows made by plastic deformation or the bellows made by processing and assembling of a compressed plate is annealed in a predetermined temperature.

When the cooling device of the semiconductor module of the present invention is assembled to the semiconductor device, the bellows is elongated, after that, the bellows fixed to the cooling plate is elongated, then, the bellows is pressed to the surface of the semiconductor elements such as the chips, the chip carriers, or the packages enclosing the LSI chips, which are opposite to the surface of the cooling plate, to compress all the bellows to cause plastic deformation so that the height and the declination of each bellows are adjusted correspondingly to that of the semiconductor elements.

Figure 7:
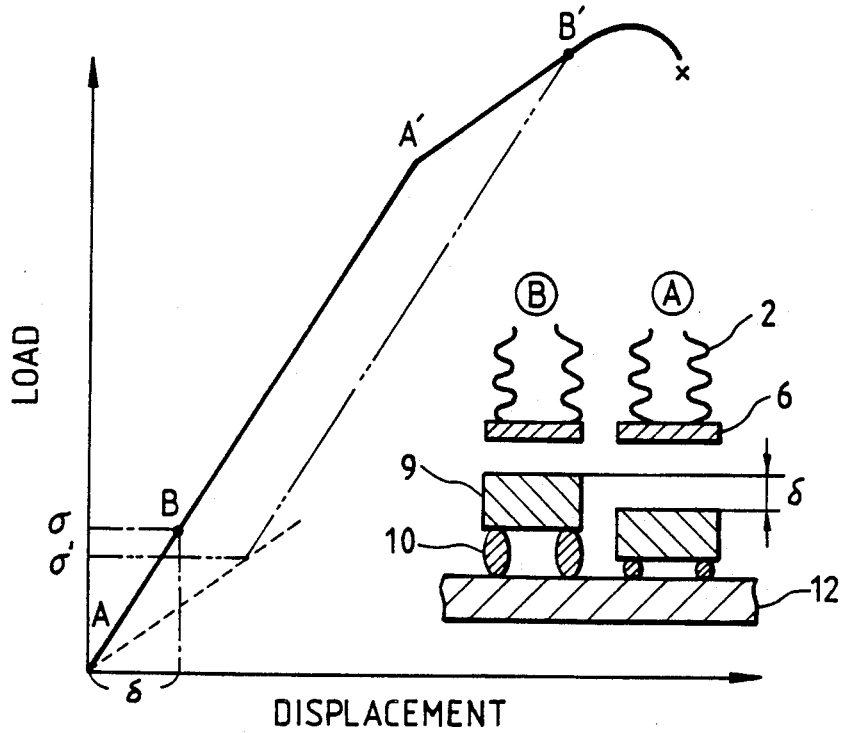
FIG. 7 is a characteristic diagram showing a relation between displacement of the conventional bellows and load.

Referring to FIG. 7, the conventional bellows 2 is enhanced in its yield point strength by cold working for the purpose of extending its plastic deformation region, so that the characteristic curve between the displacement and the load has high inclination after the yield point. Accordingly, when the length of the conventional bellows is adjusted in such a manner that the LSI chip 9 or the chip carrier is pressed to the wiring substrate soldered by CCB (control collaps bonding) for adjusting the length of the bellows by plastic deformation, the chip 9 or the CCB soldered connecting portion 10 might be broken, since a strong force is applied to the LSI chip 9. When the chip B is higher than the chip A by δ, and both chips A, B are in contact with the cooling plate 6 without plastic deformation, the load σ is impressed to the chip B. On the other hand, when both bellows corresponding to the chips A, B are compressed by plastic deformations, concretely, when both bellows are deformed to the points A', B' shown in FIG. 7, after that, the loads applied to the bellows are removed for making the chips contact to the cooling plates 6, the lengths of the bellows 2 can not be adjusted sufficiently by the plastic deformations since the declination shown by the line A'-B' after the yield point of FIG. 7 becomes large, and the high load of σ' is remained to the chip B.

Figure 8:
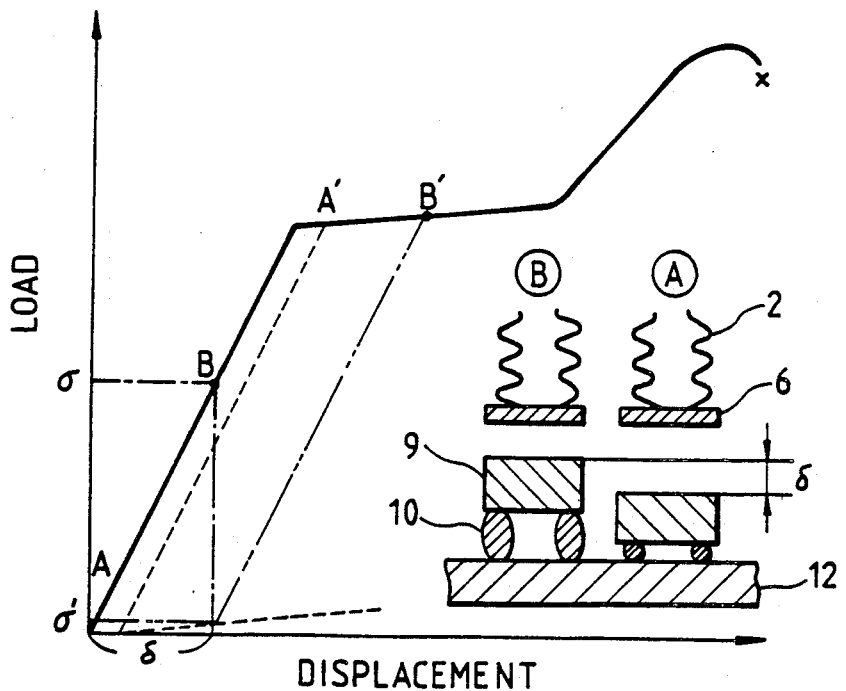
FIG. 8 is a characteristic diagram showing a relation between displacement of the bellows of the present invention and load.

FIG. 8 discloses the spring characteristic curve of the bellows in which the material is soften by annealing, and the yield strength is lowered. Although the Young's modulus (declination of the line of the load corresponding to the displacement) is not so varied by the annealing, the yield strength and the declination of the line relating to the displacement versus the load after the yield point become small. Accordingly, when the load is removed and the chips A, B are located in contact with the cooling plate 6 after the bellows corresponding to the chips A, B are deformed to the points A', B' shown in FIG. 8, a small load σ' is added to the chip B.

As explained above, when the annealed bellows is applied to the semiconductor module of the present invention, the length of the bellows is easily adjusted corresponding to the height of the chips. Even if the contacts between all chips and the corresponding cooling plates are in a good state, the loads remaining on the chips become small. Accordingly, the present invention can supply a semiconductor module which has a longer fatigue service life and is superior in cooling performance.

Figure 9A:
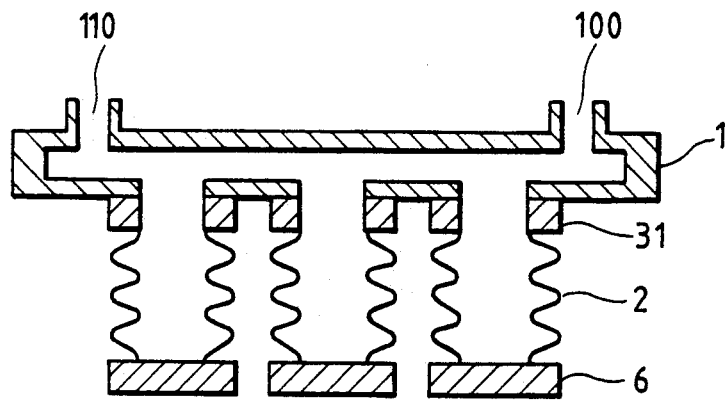
FIGS. 9(a), 9(b) and 9(c) show a construction processing of the semiconductor module of the present invention.
Figure 9B:
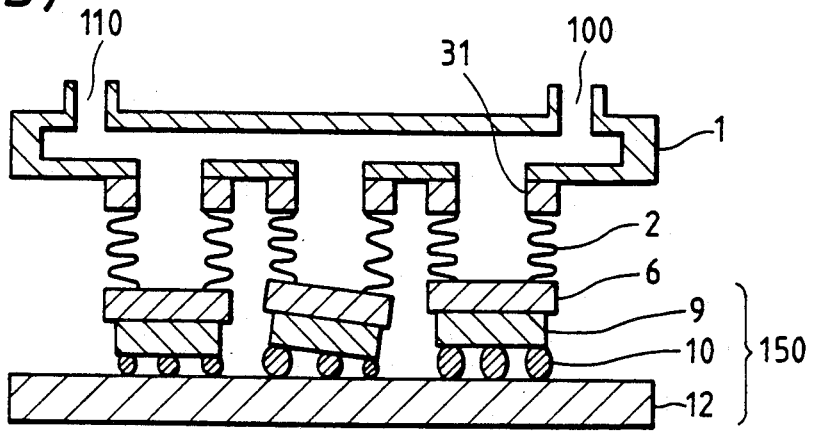

Referring to FIG. 9(a), the housing 1, the flange 31, the annealed bellows 2, and the cooling plate 6 are assembled by means of welding, soldering, or diffusion connection, after that, the bellows 2 is elongated. In the process of FIG. 9(b), the semiconductor substrate comprising the chip 9, the wiring substrate 12, and the soldered connecting portion 10 which are assembled in other process (not shown) is mounted on the cooling device manufactured by the process of FIG. 9(a), after that, all the bellows are deformed to reach the plastic deformation regions. Next, the cooling device is brought up to separate it from the wiring substrate 12. In the last process of FIG. 9(C), the chip 9 and the cooling plate 6 are connected by the low melting solder 7 having a high thermal conductivity. Accordingly, the height between the housing 1 and the wiring substrate 12 is adjusted in such a manner that all the chips 9 and the corresponding cooling chips are connected perfectly, and the loads applied to the chips 9 become smallest, respectively. The wiring substrate and the side wall 18 are sealed air-tightly by the low melting solder 16 and 17. Although the skirt 5 shown in FIGS. 3 and 5 is not disclosed in FIG. 9, the side wall 18 can be exchanged by the skirt 5 shown in FIGS. 3 and 5.

Figure 9C:
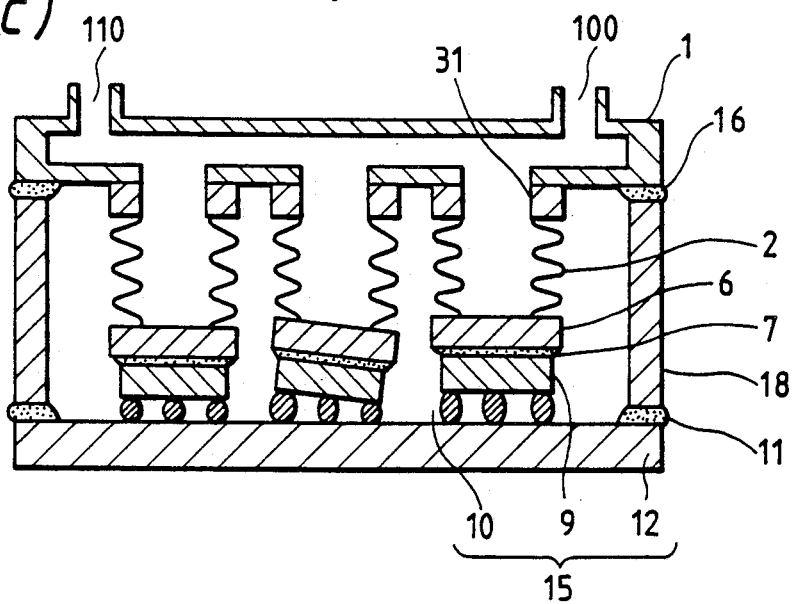

According to the embodiment shown in FIG. 9, the length of the bellows can be adjusted easily corresponding to the height and the declination of the chip. Accordingly, it is possible to provide the semiconductor module having multi-chips in which the cooling performance of the chip is enhanced and the fatigue service life of the soldered connecting portion is not deteriorated by using the cooling device which is excellent in the reliability of air-tightness and low corrosiveness. According to the embodiment disclosed in FIGS. 9(a), 9(b) and 9(c), since the cooling device and the wiring substrate are manufactured in separate processes, and the assembling of them is easy, it is possible to enhance the productivity and lower the manufacturing cost.

Figure 10:
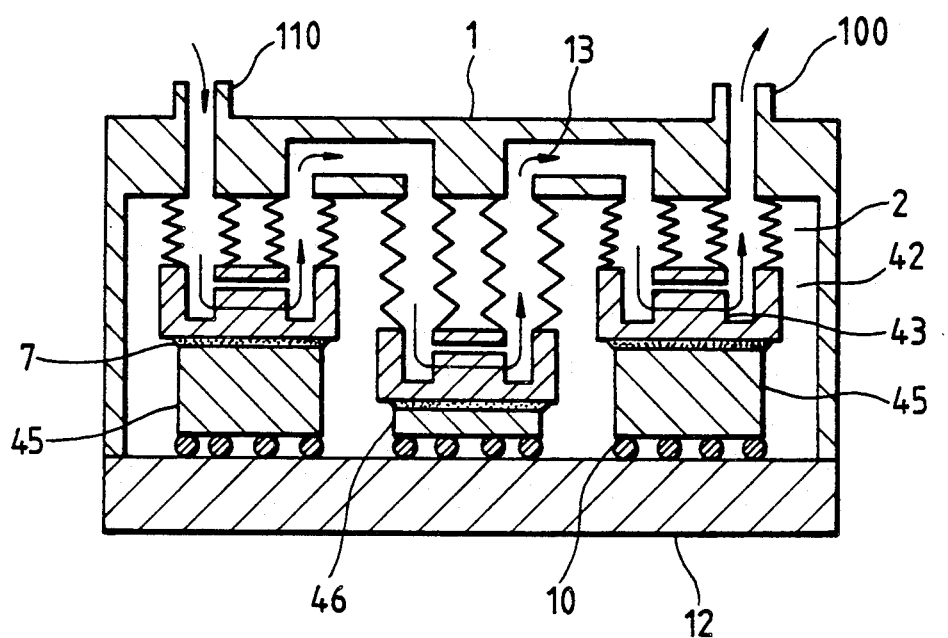
FIG. 10 shows a sectional view of a semiconductor module of the 4th embodiment of the present invention.

Referring to FIG. 10, the memory package 45 and the package 46 of the logical LSI, which are different in sizes, are mounted on the wiring substrate 12 by the solder 10. The cooling block 42 having an inlet and an outlet for the cooling water is connected to the housing 1 by two bellows 2. At the channel for conducting water within the cooling block 42, the cooling fin 43 is provided along the direction of the water flow. The cooling water which is introduced from the inlet 110 is discharged from the outlet 100 through each cooling block. The bellows 2 is manufactured by diffusion connection. The assembling of the housing 1 and the cooling block 42 is carried out by the diffusion connection at the manufacturing of the bellows at the same time. The numeral 7 denotes the low melting solder, and 13 the direction of the flowing water. The numbers of the threads and the thickness of each bellows are same. The assembling of the cooling device and the wiring substrate are carried out in the same processes shown in FIGS. 9(a), 9(b) and 9(c). In FIG. 10, the skirt 5 shown in FIGS. 3 and 4 can be provided as well as that of FIG. 9.

According to the embodiment disclosed in FIG. 10, since each connecting portion of the cooling device is connected by a diffusion connection, a cooling device results having high reliability in the strength of the connecting portion, durability and air-tightness. Since the height of the cooling block can be adjusted easily to the package surface by simple processes even if the height of each package differs largely in the order of a number of mm, it is possible to improve the assembling and the productivity, and reduce the manufacturing cost of the semiconductor module. And also it is possible to obtain a semiconductor module which is excellent in cooling performance of the package and the fatigue service life of the soldered connecting portion.

Since corrosiveness to water, particularly corrosion to a gap is large in Fe-Ni alloy or Fe-Ni-Co alloy which is suggested for use as the housing 1, air-tightness of the O ring air-tight sealing portion might be broken, and water leakage from the housing 1 might occur. The O ring 30 is deteriorated by a change with the passage of time or degraded by heat caused by soldering at assembling or repairing during the usage of a long time of 10 years. Then water leakage could occur from the breaking of the O ring 30. When a water leakage occurs during the operation of the device, and the semiconductor elements or the wiring portions are flooded with water, the device will be operated erroneously or the elements will be broken so that the user suffers serious damage.

The present invention provides a semiconductor cooling device having functions which are able to prevent the electrical wiring or the semiconductor elements from being contacted directly by water leakage and prevent damage of the semiconductor elements, misoperation of the device, or occurrence of breakdown of the semiconductor module.

According to the present invention, the assembling and the repairing of the cooling device can be easier, and water leakage occurrence rate of the cooling water can be made smaller as apparent from the following explanation.

In the device of the present invention, double O rings are inserted between the housing and the bellows cooling element and fastened mechanically for sealing air-tightly, and a sensor is provided for detecting water leakage of the cooling water at the space closed by the two O rings.

The present invention discloses that the cooling device thereof is made by double structure of O rings, namely, one outer O ring is arranged in the outside of a The cooling structure of the present invention comprises the first O ring air-tight sealing portion for sealing the cooling water and the second O ring air-tight sealing portion for making a space in which the semiconductor elements are enclosed at the outside of the first O ring. In the space enclosed by the double O rings, the sensor is arranged for detecting water leakage. By adopting the double O ring sealing structure, even if the first O ring sealing portion occurs water leakage based on the corrosion of the cooling element or the breakage of the O ring, the second O ring sealing portion can prevent that the cooling water reaches to the semiconductor elements or the signal wiring portion. By disposing the water leakage sensor between the first O ring and the second O ring, a water leakage at the first O ring sealing portion can be detected, the operation of the semiconductor device can be stopped, and the repairing of the cooling device can be taken place. Accordingly, the breakage of the semiconductor elements, or the breakdown or the misoperation of the device by short of the signal wiring can be prevented, which is caused by the water leakage at the connecting portion of the housing and the cooling element. Since the device of the present invention can be assembled by fastening mechanically the housing and the cooling element via the O rings, the assembling thereof is easy and the repairing can be done easily when the cooling element is broken.

Since the housing at the periphery of the first O ring sealing portion and the surface of the cooling element are coated by a low corrosive material, water leakage occurrence rate caused by the corrosion of the housing which has a role of air-tight sealing by contacting the O rings and the cooling element can be reduced greatly. On account of this, repairing times of the cooling device can be reduced through the using period (normally, more than 10 years) of the semiconductor device, so that the reliability of the device is improved and the maintenance costs thereof can be reduced.

Figure 11:
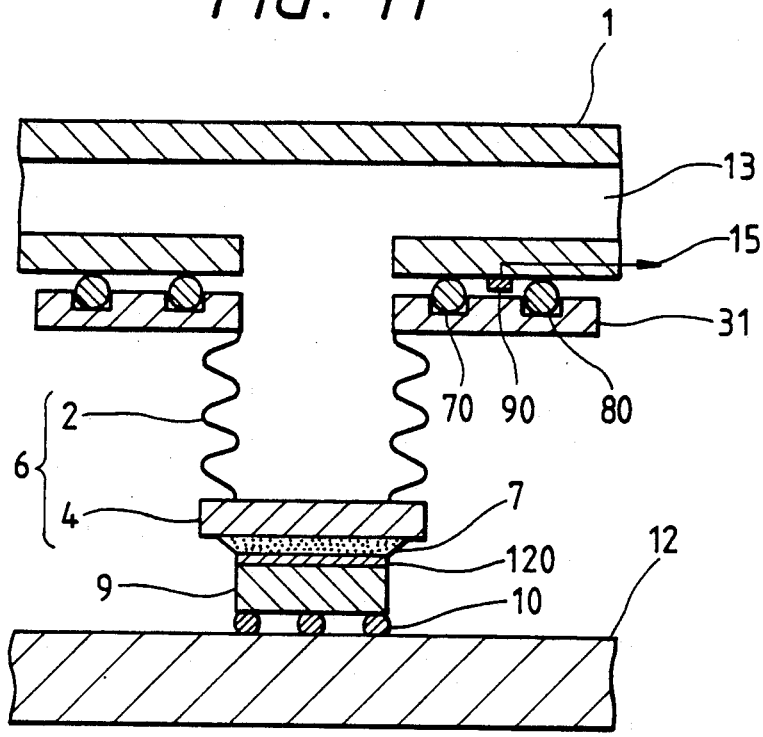
FIG. 11 shows a sectional view of a semiconductor module of the 5th embodiment of the present invention.
Figure 12:
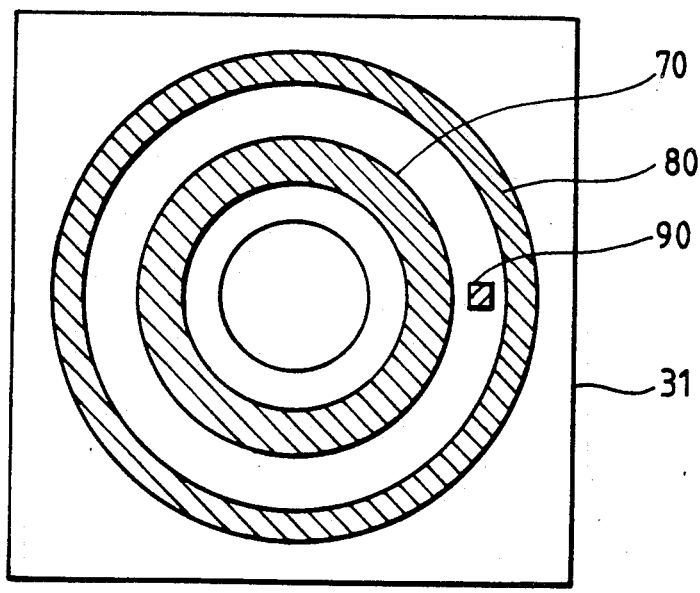
FIG. 12 shows an arrangement of O rings mounted on a flange shown in FIG. 11.

FIG. 11 shows a sectional view of the cooling device in which one cooling element is fixed to the housing by one flange. FIG. 12 shows an arrangement of the O ring mounted on the flange. In FIG. 11, on opening portion is provided to the housing 1 matching to the arrangement of the LSI chip 9. In the opening portion, the housing 1 is fixed to the flange 31 which is connected to the cooling element 6 through the two O rings 70, 80 which are arranged at the outside and the inside, respectively, on the flange 31. When the cooling device is mounted on the wiring substrate 12, the cooling plate 4 of the cooling element 6 is connected mechanically to the LSI chip 9 by the low melting solder. The humidity sensor 90 is provided at the space which is surrounded by the two O rings, the housing, and the flange. The output signal 15 of the sensor 90 is introduced outside. The flange 31 and the bellows 2 are welded or soldered. The soldering is carried out using a low corrosive material, for instance, Ag solder, Au solder, Pb solder or Ni solder. 13 denotes the duct for flowing the cooling water, 120 the metalized film, and 10 the soldered connecting portion.

In the embodiment shown in FIGS. 11 and 12, since the cooling element and the housing are fixed mechanically through the double O rings, the assembling of the cooling device is easy. Even if the cooling element is broken down by corrosion, etc., the device of the present invention is excellent in ability for repairing, since the exchange to other cooling element is easy. Since the double air-tight sealing portion is arranged between the cooling water and the space in which the LSI chip is provided, it is scarcely occurred that the LSI chip is damaged or operated erroneously by water leakage. Since the water leakage at the first air-tight sealing portion can be detected by the humidity sensor, the repairing of the cooling device is easy, in fact, the water leakage from the connecting portion of the cooling element and the housing can be prevented perfectly. In the embodiment shown in FIG. 11, the skirt 5 shown in FIGS. 3 and 4 can be provided between the cooling plate 4 and the wiring substrate 12 as well as FIG. 10.

Figure 13:
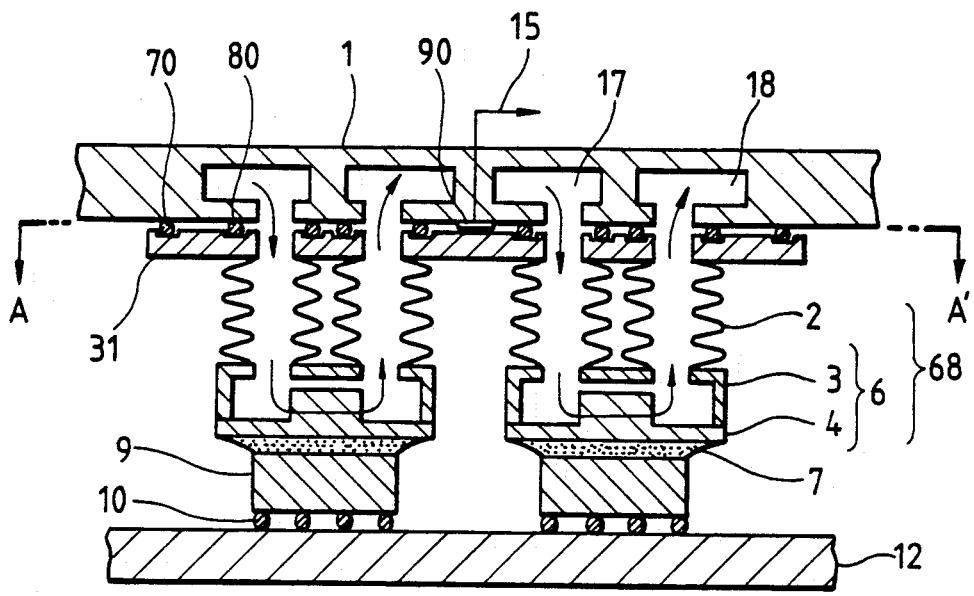
FIG. 13 shows a sectional view of a semiconductor module of the 6th embodiment of the present invention.
Figure 14:
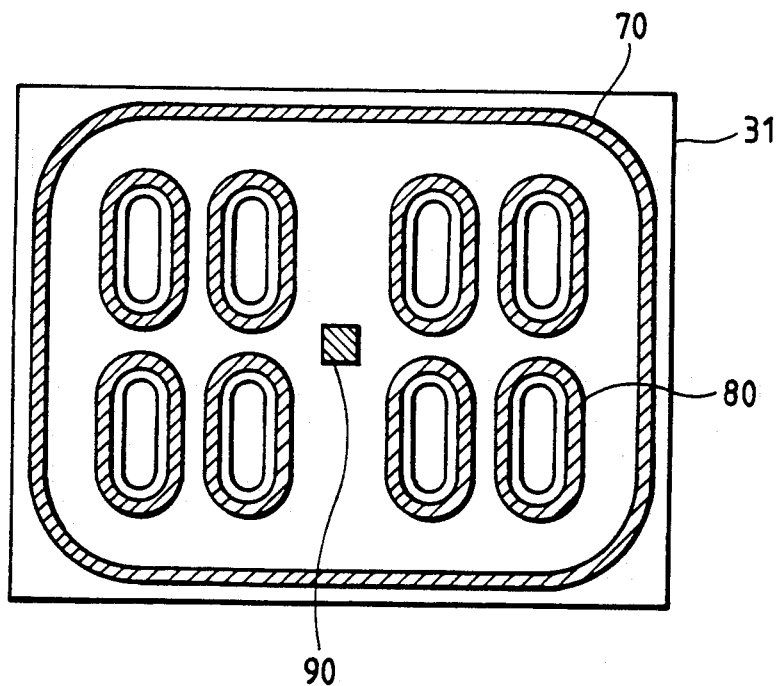
FIG. 14 shows an arrangement of O rings mounted on a flange shown in FIG. 13.

FIG. 13 shows a sectional view of the cooling device in which the cooling element comprises two bellows is fixed to the housing by using a flange. FIG. 14 shows an arrangement of O rings mounted on the flange 31. The cooling water supply duct 17 and the cooling water discharge duct 18 are provided inside the housing 1. The flange 31 fixes four cooling elements 68 corresponding to the four chips, namely, fixes eight bellows. The cooling element 68 comprises two elliptic bellows 2, the cooling fin 4 for transmitting the heat thereof to the cooling water, and the cap 3 for flowing water to the cooling fin and interrupting air-tightly the space in which the LSI chip 9 is provided. The flange 31 is fixed to the housing 1 mechanically through the inside eight O rings 80 and the outside one O ring 70. The water leakage sensor 90 is provided at the space surrounded by the inside eight O rings, the outside one O ring, the flange and the housing. The cooling fin 4 and the LSI chip mounted on the wiring substrate 12 are connected by the low melting solder 7. The assembling of each part of the cooling element and the assembling of the flange and the cooling element are carried out by means of welding, diffusion connection, and soldering, etc. The portion in which each O ring on the flange is disposed, is formed a recess which fits to the dimension of the O ring. The housing to which the inside O rings are connected, and the metal surface of the flange are coated by Ti or Ti alloy. In the embodiment shown in FIG. 13, the skirt (not shown) can be disposed between the cooling fin 4 and the wiring substrate 12 as well as FIGS. 3 and 5.

According to the embodiment shown in FIG. 13, the assembling, repairing, and reliability of the cooling device are excellent as well as FIG. 10, so that the maintenance and the reliability can be enhanced remarkably.

Since a number of inside O rings are enclosed within the outside O ring for making double structure of O rings, the chip arrangements can be densely, and the number of the water leakage sensor can make small. Even if high corrosive material has to be used as the housing for matching the thermal expansion coefficients of the wiring substrate and the housing, occurrence times of water leakage caused by corrosion thereof can be reduced by using Ti or Ti alloy which is coated on the surface thereof, since Ti or Ti alloy is low corrosive.

What we claim is:

1. A cooling device for a semiconductor module having a number of semiconductor elements mounted on a wiring substrate, comprising:
   (a) a cooling fin soldered on each of the semiconductor elements for cooling the semiconductor elements;
   (b) a plurality of bellows each forming a channel for conducting a flow of a cooling medium, one open end of each bellows being fixed to a cooling fin;
   (c) a flange connected mechanically to the other open end of each of said bellows;
   (d) a housing having a channel for conducting a flow of said cooling medium, said flanges being mounted on said housing so that the channel in said housing communicates with the channels in said bellows; and
   (e) a plurality of O-rings which are inserted between said flanges and said housing for sealing air-tightly said flanges to said housing, wherein said O-rings comprise a plurality of first O-rings having a first diameter for sealing air-tightly each channel for conducting the flow of said cooling medium therethrough, and at least one second O-ring having a second diameter larger than said first diameter and arranged to enclose a number of the first O-rings inside the second O-ring in the same place.

2. A cooling device of a semiconductor module according to claim 1, wherein said cooling fin has a skirt at one end thereof, and said skirt is connected to said semiconductor elements by solder having a low melting point.

3. A semiconductor module, comprising:
   a wiring substrate having a plurality of recesses for accommodating semiconductor elements;
   a plurality of semiconductor elements each mounted in a respective recess on said wiring substrate;
   a respective cooling fin connected to each of the semiconductor elements, each cooling fin having a high thermal conductivity and being cooled by contact with said cooling medium;
   a housing having a channel for conducting a flow of the cooling medium into contact with each cooling fin; and
   a plurality of bellows connecting the channel in the housing to the cooling fin to direct a flow of the cooling medium within the housing into contact to the cooling fin, wherein said cooling fin has a skirt at least at one end thereof, said skirt being connected to said wiring substrate by solder having a low melting point.

4. A semiconductor module according to claim 3, wherein said semiconductor elements comprise LSI chips.

5. A semiconductor module according to claim 4, wherein a number of LSI chips are enclosed in chip carriers, respectively, and lead wires connected to said LSI chips are lead out of the chip carriers to be soldered with said wiring substrate.

6. A semiconductor module according to claim 3, wherein an inert gas is charged within a space at a peripheral portion of said semiconductor chip which is sealed air-tightly within said housing.

7. A semiconductor module according to claim 6, wherein said inert gas comprises helium.

8. A semiconductor module according to claim 3, wherein said skirt is equipped around the entire periphery of said cooling plate, and said semiconductor elements are sealed air-tightly by said skirt.

9. A cooling device of a semiconductor module according to claim 1, wherein a humidity sensor is arranged in a space between said first O ring and said second O ring.

10. A cooling device for a semiconductor module having a number of semiconductor elements mounted on a wiring substrate, comprising:
    (a) a cooling fin soldered on each of the semiconductor elements for cooling the semiconductor elements;
    (b) a housing having a channel for conducting the flow of a cooling medium; and
    (c) a plurality of bellows each having a channel for conducting the flow of said cooling medium, one open end of each of said bellows being fixed to a cooling fin and the other open end thereof being fixed to said housing, wherein each bellows is first annealed and then cold worked for the purpose of extending the plastic deformation range thereof.

11. A cooling device of a semiconductor module according to claim 10, wherein said bellows is processed in such a manner that said bellows fixed to said cooling plate is elongated, after that, said bellows is pressed to a position of said semiconductor elements mounted on said wiring substrate to compress all bellows to reach plastic deformation regions, thereby a height and a declination of the bellows are adjusted corresponding to that of the semiconductor elements, respectively.

* * * * *